US011462432B2

(12) United States Patent
Truong et al.

(10) Patent No.: US 11,462,432 B2
(45) Date of Patent: Oct. 4, 2022

(54) DUAL SIDE DE-BONDING IN COMPONENT CARRIERS USING PHOTOABLATION

(71) Applicant: Intel Corporation, Santa Clara, CA (US)

(72) Inventors: Frank Truong, Gibert, AZ (US); Praneeth Akkinepally, Tempe, AZ (US); Chelsea M. Groves, Chandler, AZ (US); Whitney M. Bryks, Chandler, AZ (US); Jason M. Gamba, Gilbert, AZ (US); Brandon C. Marin, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 385 days.

(21) Appl. No.: 15/922,749

(22) Filed: Mar. 15, 2018

(65) Prior Publication Data

US 2019/0287841 A1 Sep. 19, 2019

(51) Int. Cl.
| | |
|---|---|
| *B32B 43/00* | (2006.01) |
| *H01L 21/683* | (2006.01) |
| *H01L 21/687* | (2006.01) |
| *C09J 5/06* | (2006.01) |
| *H01L 21/02* | (2006.01) |

(52) U.S. Cl.
CPC ............ *H01L 21/6835* (2013.01); *C09J 5/06* (2013.01); *H01L 21/68714* (2013.01); *B32B 43/006* (2013.01); *H01L 21/02098* (2013.01); *H01L 2221/68381* (2013.01); *Y10T 156/1158* (2015.01); *Y10T 156/1917* (2015.01)

(58) Field of Classification Search
CPC . B32B 43/006; B32B 38/10; Y10T 156/1158; Y10T 156/1917
See application file for complete search history.

(56) References Cited

U.S. PATENT DOCUMENTS

| | | | |
|---|---|---|---|
| 8,679,280 B2* | 3/2014 | Dang | B23K 26/0823 156/247 |
| 2008/0302481 A1* | 12/2008 | Berger | H01L 21/6836 156/712 |
| 2013/0084459 A1* | 4/2013 | Larson | C09D 133/16 428/422 |
| 2014/0042649 A1* | 2/2014 | Ke | H01L 27/1218 264/1.36 |
| 2014/0144593 A1* | 5/2014 | Dang | H01L 21/67092 156/712 |
| 2015/0083343 A1* | 3/2015 | Fujii | B32B 43/006 156/712 |
| 2016/0133468 A1* | 5/2016 | Doany | B32B 43/006 438/795 |
| 2017/0348959 A1* | 12/2017 | Hendriks | B32B 43/006 |
| 2018/0108558 A1* | 4/2018 | Yin | H01L 21/68714 |

\* cited by examiner

*Primary Examiner* — Philip C Tucker
*Assistant Examiner* — Nickolas R Harm
(74) *Attorney, Agent, or Firm* — Essential Patents Group, LLP.

(57) ABSTRACT

A system is disclosed, which comprises a component carrier having a first side, and a second side opposite the first side; and a light source to couple light into the carrier. In an example, the carrier is to propagate, through internal reflection, at least a portion the light to both the first and second sides of the carrier. The portion of light may be sufficient to release a first component and second component affixed to the first and second sides of the carrier via a first photosensitive layer and second photosensitive layer, respectively.

20 Claims, 10 Drawing Sheets

DUAL SIDE DE-BONDING IN COMPONENT CARRIERS USING PHOTOABLATION

BACKGROUND

Often times, a component (e.g., a coreless substrate, a wafer, etc.) may be formed on a dummy core or a component carrier. For example, the carrier may have two components formed on two respective sides of the carrier. Typically, the components may be de-bonded or detached from the carrier using chemical de-bonding, mechanical de-bonding, thermal de-bonding, etc. Photoablation process cannot be generally used for de-bonding, as the bonding layers cannot be fully exposed to light (e.g., because there are components on both sides of the carrier, thereby blocking light to a bonding layer between a component and the carrier).

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
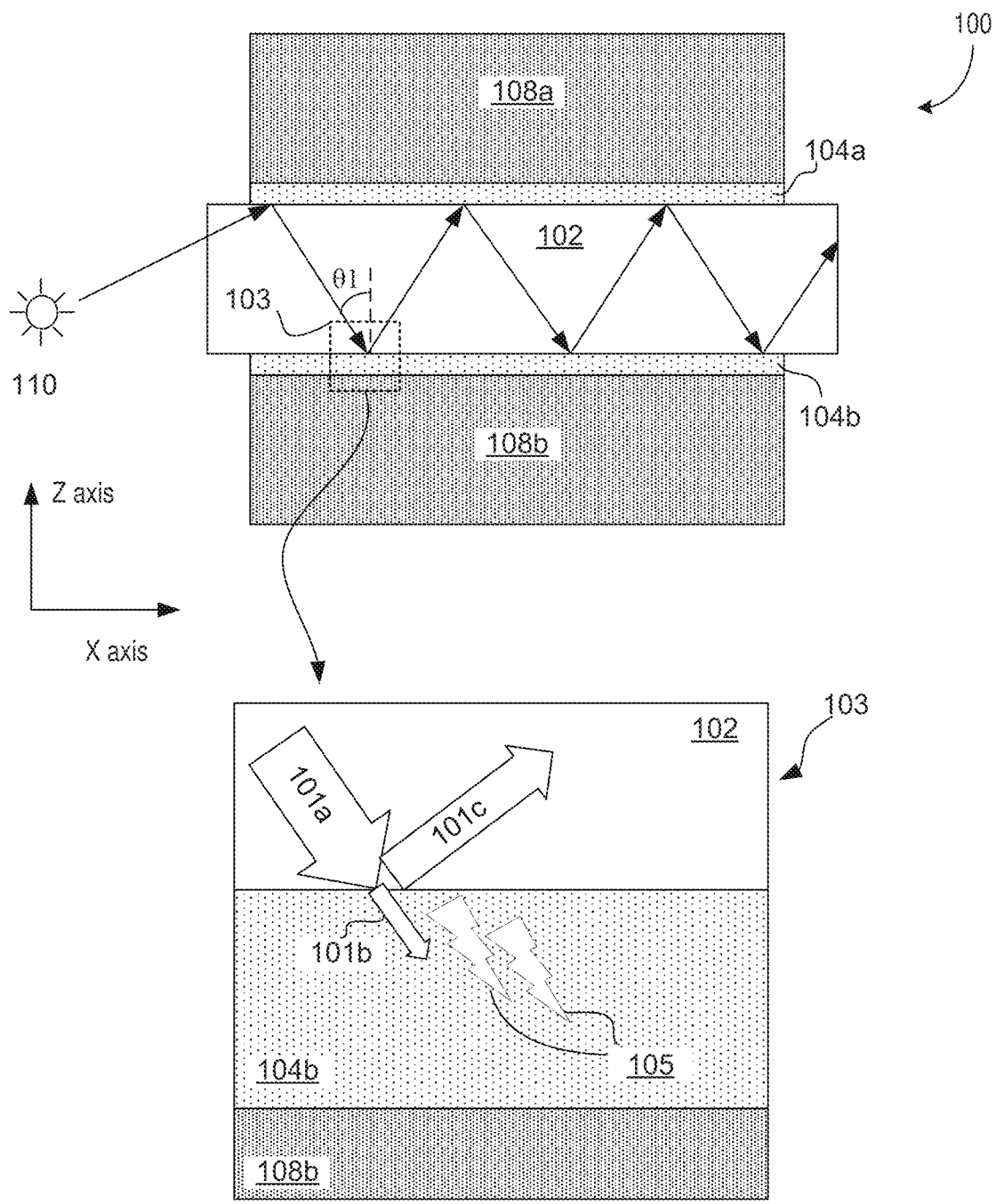
FIG. 1 schematically illustrates cross sectional view of a system including a component carrier (also referred to as a carrier) having two components attached respectively on two sides of the carrier via respective photosensitive bond layers, wherein internal reflection of light is used to release the components from the carrier, according to some embodiments.

In some embodiments, a component carrier may have component buildup on two sides of the carrier. For example, a first component (e.g., a coreless substrate, a semiconductor package, a wafer, and/or the like) may be attached to a first side of the carrier via a first photosensitive layer. The first photosensitive layer may be a bond layer, or a layer adjacent to a bond layer, where the bond layer (e.g., an adhesive layer) bonds or attaches the first component to the first side of the carrier. Similarly, a second component may be attached to a second side of the carrier via a second photosensitive layer. When the components are to be de-bonded or detached from the carrier, the first and second photosensitive layers may be exposed to light of appropriate wavelength (e.g., an Ultraviolet light, etc.). The exposure may cause photoablation process in the first and second photosensitive layers, as a result of which the components may be released from the component carrier.

The carrier may receive the light for the photoablation process from a light source. In some embodiments, the carrier is to propagate, through internal reflection, at least a portion of the light to both the first and second sides of the carrier. For example, when the light is projected onto a boundary between the carrier and a section of the first photosensitive layer, a small portion of the light is absorbed in the section of the first photosensitive layer, triggering the photoablation process in the section of the first photosensitive layer. Remaining portion of the light may be reflected, via total internal reflection principle, towards a boundary between the carrier and a section of the second photosensitive layer. Again, a small portion of the light is absorbed in the section of the second photosensitive layer, triggering the photoablation process in the section of the second photosensitive layer—remaining portion of the light may be reflected, via total internal reflection principle, towards the boundary between the carrier and another section of the first photosensitive layer. This process may be repeated until, for example, the light exits the carrier and/or an angle of incidence of light is too low for internal reflection. In some embodiments and as will be discussed in further details herein, various arrangements can be made (e.g., to the carrier, to the light source, and/or to the photosensitive layers) to make the internal reflection of the light more effective.

In an example, mechanical, thermal and/or chemical de-bonding approaches in a component carrier may have adverse effects on the component quality, and photoablation may be a preferred approach. Various embodiments discussed herein allow dual sided processing in a component carrier, and de-bonding of the components via photoablation process. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on." The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

FIG. 1 schematically illustrates cross sectional view of a system 100 including a component carrier 102 (also referred to as carrier 102) having two components 108a and 108b attached respectively on two sides of the carrier 102 via respective photosensitive bond layers 104a, 104b (also referred to as bond layers 104a, 104b), wherein internal reflection of light is used to release the components 108a, 108b from the carrier 102, according to some embodiments.

Elements referred to herein with a common reference label followed by a particular number or alphabet may be collectively referred to by the reference label alone. For example, bond layers 104a, 104b may be collectively and generally referred to as bond layers 104 in plural, and bond layer 104 in singular. Similarly, components 108a, 108b may be collectively and generally referred to as components 108 in plural, and component 108 in singular.

In some examples, individual ones of the components 108a, 108b may be a semiconductor substrate (e.g., a coreless substrate), a wafer, a semiconductor package, and/or the like. While the components 108a, 108b are being processed (e.g., formed), the components 108a, 108b are attached or bonded to the carrier 102 via respectively bond layers 104a, 104b. The carrier 102 supports the components 108a, 108b, enhances the warpage performance of the components 108a, 108b, etc. Once at least a part of the formation of the components 108a, 108b are complete, the components 108a, 108b may be released from the carrier 102 via a de-bonding process.

In some embodiments, the system 100 comprises a light source 110. The light source 100 may generate light of appropriate wavelength, e.g., which may result in photoablation in the photosensitive bond layers 104a, 104b. As an example, the light source 110 may generate laser light, or light of another appropriate wavelength. Merely as an example, the light source 110 may generate Ultraviolet (UV) light. In another example, a wavelength of the light generated by the light source 110 may be 350 nanometer (nm) or less, may be less than 308 nm or less, may be 400 nm or less, and/or the like. In another example, the light source 110 may generate Infrared (IR) light. In an example, a wavelength of the light generated by the light source 110 may be from about 1000 nm to about 10 micrometers. The principles of this disclosure are not limited by a wavelength and/or a type of light generated by the light source 110. As illustrated in FIG. 1, light from the light source 110 may be projected on a side surface (e.g., a vertical edge) of the carrier 102.

The photosensitive bond layers 104a, 104b may include any appropriate bond or adhesive layer, which may be photosensitive (e.g., results in photoablation or de-bonding when exposed to light of appropriate wavelength, such as light generated by the light source 110). The photosensitive bond layers 104a, 104b may have at least two properties: bonding or adhesive property to attach the components 108a, 108b to the carrier 102, and being photosensitive to light of appropriate wavelength. The photosensitive bond layers 104a, 104b may be dual sided adhesive layer (e.g., adhesive on both sides, to attach a component 108 and the carrier 102). Any appropriate material may be used for the photosensitive bond layers 104a, 104b, such as but not limited to, evaporated glass, polymers, spin-on glasses, resists, polyimides, graphene, and/or the like. The principles of this disclosure are not limited by a type of material used for the photosensitive bond layers 104a, 104b.

In some examples, when the components 108a, 108b are to be released from the carrier 102, photoablation may be performed for de-bonding. For example, light of appropriate wavelength (e.g., laser light) may be projected on the photosensitive bond layers 104a, 104b, which may result in photoablation of the photosensitive bond layers 104a, 104b, and result in the de-bonding or detachment of the components 108a, 108b from the carrier 102. In an example, photoablation of the photosensitive bond layers 104a, 104b may be through one or more of a photochemical process, a photo-thermal process, etc.

In some embodiments, the carrier 102 is transmissive of light having appropriate wavelength, e.g., transmissive of light generated by the light source 110. Merely as an example, the carrier 102 is transmissive of light having wavelength of 350 nm or less, 308 nm or less, 400 nm or less, and/or the like. The carrier 102 may propagate the light generated by the light source 110, without substantial absorption of the light. The carrier 102 acts as a transparent or near transparent medium to the light from the light source 110.

The carrier 102 may include any appropriate material that is transmissive of the light, and that has appropriate mechanical and/or thermal properties to act as a support to the components 108a, 108b. Merely as an example, the carrier 102 includes glass, fiberglass, fiber-reinforced plastic with glass fiber, a thermoset polymer matrix, a thermoplastic, fiberglass reinforced plastic, and/or the like. The principles of this disclosure are not limited by a type of material used for the carrier 102.

In some embodiments, light from the light source 110 may be propagated to various sections of the bond layers 104a, 104b via internal reflection (e.g., total internal reflection). FIG. 1 illustrates an expanded view of a section 103 (illustrated using dotted lines) of the carrier 102, the bond layer 104b, and the component 108b. In the expanded view of the section 103, light from the light source 110 are symbolically illustrated using arrows. For example, light 110a from the light source 110 is projected on an interface or boundary between the carrier 102 and the bond layer 104b. A part 101b of the light 101a is transmitted to the bond layer 104b and absorbed by the bond layer 104b, and another part 101c of the light 101a is reflected by the boundary between the carrier 102 and the bond layer 104b. The reflection of the light 101c is due to the phenomenon of total internal reflection.

Total internal reflection is the phenomenon which occurs when a propagated wave (e.g., light from the light source 110) strikes a medium boundary (e.g., boundary between the carrier 102 and one of the bond layers 104a, 104b) at an angle larger than a particular critical angle with respect to the normal to the surface. If the refractive index is lower on the other side of the boundary and the incidence angle is greater than the critical angle, the wave cannot pass through and is entirely reflected. The critical angle is the angle of incidence above which the total internal reflection occurs. This is particularly common as an optical phenomenon, where light waves are involved. When a wave reaches a boundary between different materials with different refractive indices, the wave may in general be partially refracted at the boundary surface, and partially reflected. However, if the angle of incidence is greater than the critical angle—the angle of incidence at which light is refracted such that it travels along the boundary—then the wave will not cross the boundary, but will instead be totally reflected back internally (e.g., due to the conservation of momentum). This may occur when the wave in a medium with a higher refractive index reaches a boundary with a medium of lower refractive index. For example, it may occur with light reaching air from glass, but not when reaching glass from air.

To achieve total internal, the refractive index of the carrier 102 may have to be higher than the refractive index of the layer 104. As will be discussed herein later in further details, in some embodiments, the carrier 102 and/or the bond layers 104 may be treated or tuned to control their respectively refractive indices.

If the angle at which the light 101a strikes the boundary of the carrier 102 and the bond layer 101b is higher than the critical angle, at least a portion of the light 101 is reflected as light 101c. For example, as illustrated in FIG. 1, the incidence angle of the light at a boundary of the carrier 102 and the bond layer 104b is θ1. If the angle θ1 is greater than the critical angle, then total internal reflection may occur, as illustrated in FIG. 1.

In an ideal total reflection scenario, most or all of the light is reflected. For example, in fiber optic communication cable employing total internal reflection, more than 99.99% of the incident light is reflected. However, the parameters of the carrier 102 and/or the bond layers 104a, 104b may be tuned to achieve relatively less reflection, e.g., such that at least a portion 101b of the light 101a is absorbed by the bond layer 104b.

A "total" internal reflection may generally imply 100% reflection of light from the boundary of the carrier 102 and a layer adjacent to the carrier 102 (e.g., the bond layer 104 in FIG. 1). However, for purposes of this disclosure, total internal reflection (TIR) will imply internal reflection where a majority of the incident light (e.g., 100% or less) is reflected from the boundary and some portion of the light may be possibly absorbed in the layer adjacent to the carrier 102, e.g., as illustrated in the expanded view of the section 103. For the purposes of this disclosure, the terms "total internal reflection" and "internal reflection" may be used interchangeably, and both the terms may imply 100%, or less than 100%, reflection at a boundary of the carrier 102 and an adjacent layer (e.g., bond layers 104).

In some embodiments, the light portion 101b absorbed by the bond layer 104a (e.g., transmitted to the bond layer 104a, without being internally reflected) may trigger the photoablation process 105 in the bond layer 104b (and similar photoablation process in the bond layer 104a). The photoablation process is symbolically, and merely as an example, illustrated using symbols 105. In an example, photoablation in the photosensitive bond layers 104a, 104b may be through one or more of a photochemical process, a photo-thermal process, etc.

The reflected light 101c may hit the bond layer 104a through the carrier 120, and again result in partial reflection (e.g., from the boundary of the bond layer 104a and the carrier 102), and partial absorption in the bond layer 104a. The partial absorption in the bond layer 104a may again result in photoablation process in the section of the bond layer 104a. This process may continue, as the light is reflected numerous times between the two boundaries, as illustrated in FIG. 1. Thus, partial transmission of the light from the light source 101 to the bond layers 104 (e.g., by avoiding the internal reflection) may result in the photoablation process 105, whereas the partial internal reflection of the light results in propagation of the light throughout the carrier 102 and to various sections of the bond layers 104. Accordingly, various sections of the bond layers 104a, 104b may be exposed to the light from the source 110, e.g., due to the internal reflection of the light. Hence, the photoablation process may occur in the various sections of the bond layers 104a, 104b. As a result of such photoablation process occurring in various sections of the bond layers 104a, 104b, the bond layers 104a, 104b may detach from the carrier 102, thereby separating the components 108a, 108b from the carrier 102.

In an example, once the internal reflection of the light commences in the carrier 102, the light may continue reflecting between the two boundaries (e.g., between a first boundary between the carrier 102 and the bond layer 104a, and between a second boundary between the carrier 102 and the bond layer 104b), until, for example, the incidence angle of the light at a boundary is not capable of internal reflection, and/or until the light escapes via another edge of side surface of the carrier 102. If the incidence angle of the light at a boundary is not capable of internal reflection, the light may be fully transmitted into the corresponding section of the corresponding bond layer, thereby resulting in a higher rate of the photoablation process in that section of the bond layer.

In some embodiments, the photoablation process discussed in this disclosure may be based on photothermal ablation and/or photochemical ablation. In some embodiments, the photosensitive layers adjacent to the carrier 102 may have higher sensitivity to light from the light source 110 (e.g., higher sensitivity to ultraviolet light), which may result in a higher photoablation rate. For example, the photosensitive layers (e.g., bond layers 104) are almost entirely protected from incoming ambient light (e.g., by the carrier 102 on one side, and by the corresponding component 108 on another side). Thus, extremely light (e.g., UV light) sensitive photosensitive layers may be used. This ensures that the light-induced debond process occurs with relatively small processing time, and/or by using relatively small energy from the absorbed light.

Figure 2:
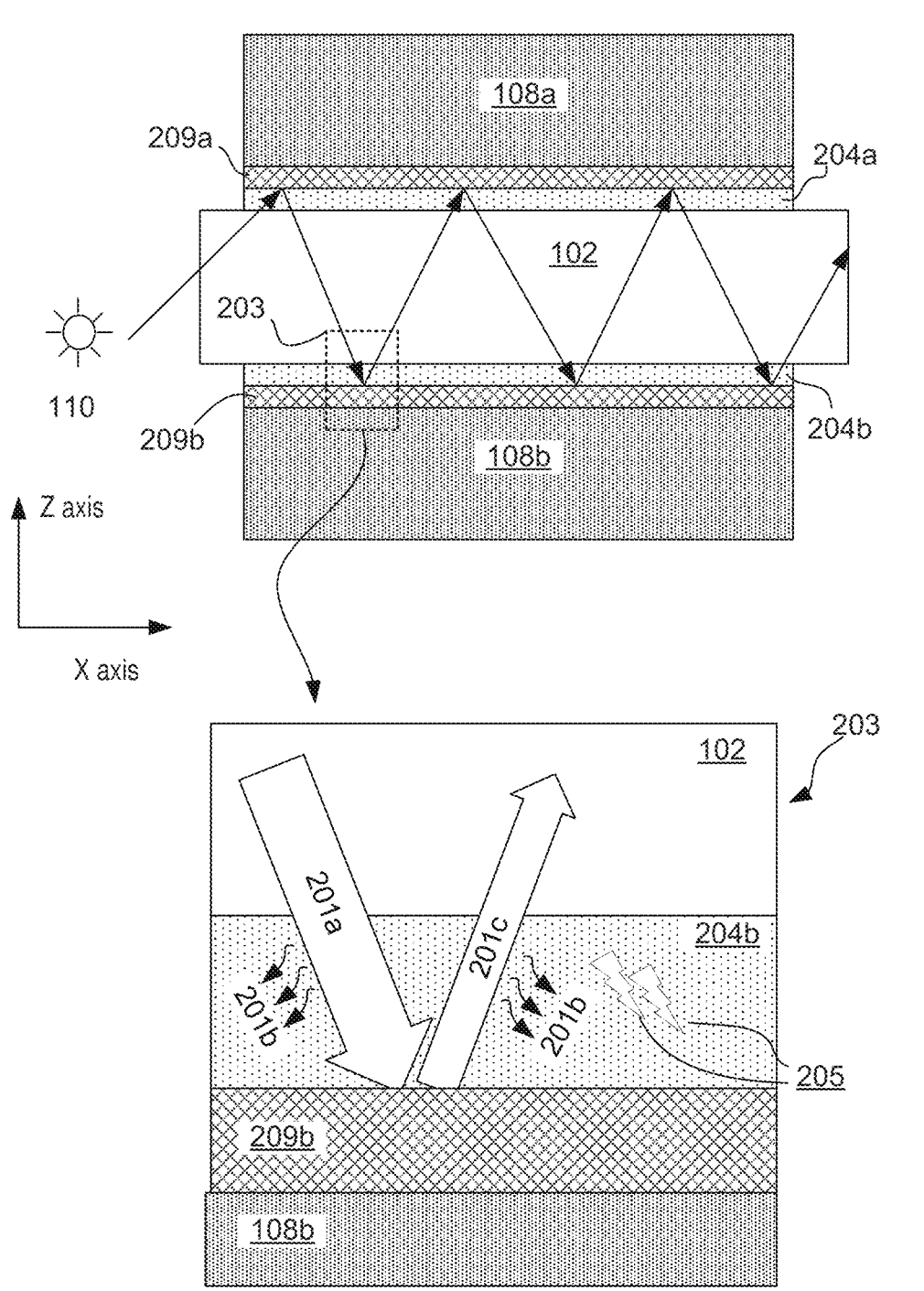
FIG. 2 schematically illustrates cross sectional view of a system including a component carrier having two components attached respectively on two sides of the carrier via respective transmissive photosensitive bond layers, wherein internal reflection of light is used to release the components from the carrier, according to some embodiments.

FIG. 2 schematically illustrates cross sectional view of a system 200 including the component carrier 102 having two components 108a and 108b attached respectively on two sides of the carrier 102 via respective transmissive photosensitive bond layers 204a, 204b, wherein internal reflection of light is used to release the components 108a, 108b from the carrier 102, according to some embodiments.

The system 200 is at least in part similar to the system 100 of FIG. 1. Some of the elements of the two systems are common and are labeled using same labels. For example, both systems 100 and 200 include the carrier 102, the light source 110, and components 108a, 108b respectively attached to two sides of the carrier 102.

In some embodiments, the component 108a is attached to the carrier 102 via bond layer 204a and a layer 209a, and the component 108b is attached to the carrier 102 via bond layer 204b and a layer 209c. The layers 209 may be a part of the respective bond layers 204 (although illustrated separately). For example, a bond or adhesive layer may comprise the photosensitive layer 204 and the layer 209. In another example, the layer 209 may be deposited on the bond layer 204, e.g., subsequent to the deposition of the bond layer 204; and then component 108 may be formed on the layer 209. In yet another example, the layer 209 may be a part of the component 108a.

In some embodiments, the layers 209 are not photosensitive. Also, a refractive index of the layers 209 may be different from the refractive indices of one or both the carrier 102 or the photosensitive bond layers 204. The layers 209 need not be transmissive of the light from the light source 110. Any appropriate material may be used for the layer 209.

As illustrated in the expanded view of a section 203 of the system 200, light 201a may be projected to the bond layer 204b through the carrier 102. The bond layer 204b may be at least in part transmissive to the light 201a, and the light 201a may propagate through the bond layer 204b (e.g., without internal reflection) and reach a boundary of the bond layer 204b and the layer 209b. The internal reflection may occur in boundary of the bond layer 204b and the layer 209b, and the light 201a may be reflected as light 201c towards the carrier 102. Thus, the bond layer 204 may refract the light (although such refraction is not illustrated in the expanded view in FIG. 2), but the boundary of the carrier 102 and the bond layer 204 may not internally reflect the light.

In some embodiments, portions 201b of the light 201a may also be absorbed by the bond layer 204b. For example, while the light is being transmitted through the bond layer 204a towards the boundary (e.g., boundary of the bond layer 204b and the layer 209b) and/or is being transmitted through the bond layer 204a after reflection from the boundary, portion 201b of the light may be absorbed by the bond layer 204b. This portion 201b may trigger the photoablation process 205 in the bond layer 204, which may result in de-bonding of the component 108b.

In the embodiments of FIG. 2, any portion of the light 201a need not be transmitted to the layer 209b (e.g., as no photoablation process is to occur in the layer 209b). Thus, ideally, the internal reflection at the boundary of the bond layer 204b and the layer 209b may approach 100%, without compromising on the photoablation process occurring in the bond layer 204b. In another example, the internal reflection at the boundary of the bond layer 204b and the layer 209b may be less than 100%.

In FIGS. 1 and 2, the photoablation process may occur in the bond layer 104, or 204. However, in some examples, the photoablation process may occur in another layer, as illustrated in FIG. 3.

Figure 3:
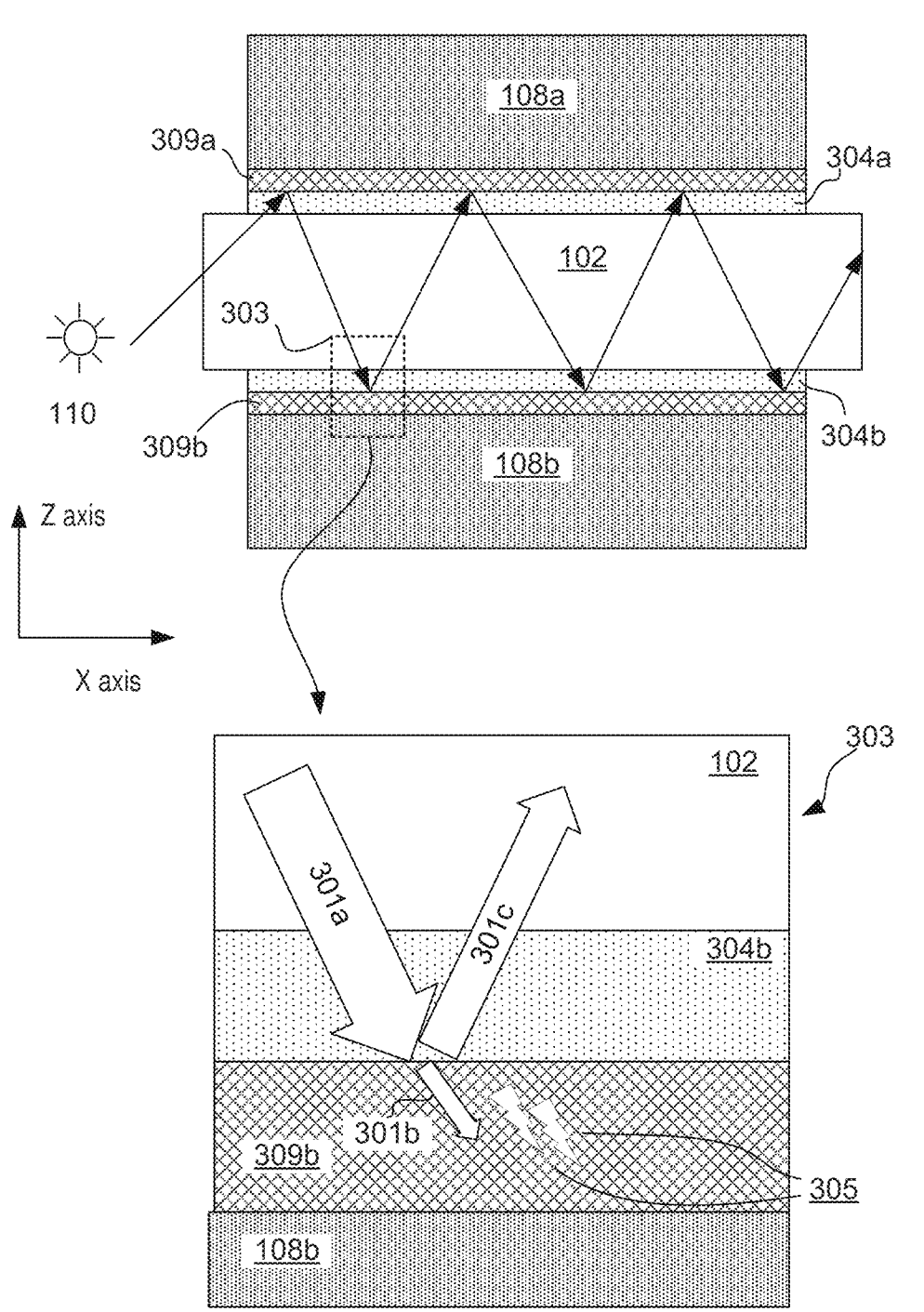
FIG. 3 schematically illustrates cross sectional view of a system including a component carrier having two components attached respectively on two sides of the carrier via respective transmissive bond layers, wherein internal reflection of light is used to release the components from the carrier, and wherein photoablation process for the release occurs in a layer different from a bond layer, according to some embodiments.

FIG. 3 schematically illustrates cross sectional view of a system 300 including the component carrier 102 having two components 108a and 108b attached respectively on two sides of the carrier 102 via respective transmissive bond layers 304a, 304b, wherein internal reflection of light is used to release the components 108a, 108b from the carrier 102, and wherein photoablation process for the release occurs in a layer different from the bond layers 304a, 304b, according to some embodiments.

The system 300 is at least in part similar to the system 200 of FIG. 2. For example, some of the elements of the two systems are common and are labeled using same labels. For example, both systems 200 and 300 includes the carrier 102, the light source 110, and components 108a, 108b respectively attached to two sides of the carrier 102.

Also, similar to FIG. 2, in the system 300 of FIG. 3, the component 108a is attached to the carrier 102 via bond layer 304a and a layer 309a, and the component 108b is attached to the carrier 102 via bond layer 304b and a layer 309c. In an example, the layer 304 and the bond layer 304 may be a part of a same bond or adhesive layer. In another example, the layer 309 may be deposited on the bond layer 304, e.g., subsequent to the deposition of the bond layer 304; and then component 108 may be formed on the layer 309. In yet another example, the layer 309 may be a part of the component 108a.

In some embodiments, the bond layers 304 may be transmissive to the light from the light source 110. Also, in the system 300, the bond layers 304 may not be photosensitive to the light from the light source 110. Thus, propagation or absorption of light from the light source 110 by the bond layers 304 may not trigger a photoablation process in the bond layers 304.

In some embodiments, the layers 309 may be photosensitive to the light from the light source 110. Thus, the photoablation process may occur in the layers 309. Also, a refractive index of the layers 309 may be different from the refractive indices of one or both the carrier 102 or the bond layers 304. For example, the refractive index of the layers 309 may be higher than the refractive indices of one or both the carrier 102 or the bond layers 304, to cause internal reflection of light at the boundary of the bond layer 304b and the photosensitive layer 309b. The layers 309 need not be transmissive of the light from the light source 110. Any appropriate material may be used for the layer 309. The bond layer 304 may refract the light (although such refraction is not illustrated in the expanded view in FIG. 3), but the boundary of the carrier 102 and the bond layer 304 may not internally reflect the light.

As illustrated in an expanded view of a section 303 of the system 300, light 301a may be projected to the bond layer 304b through the carrier 102. The bond layer 304b may be at least in part transmissive to the light 301a, and the light 301a may propagate through the bond layer 304b and reach a boundary of the bond layer 304b and the layer 309b. The internal reflection may occur in boundary of the bond layer 304b and the layer 309b, and the light 301a may be reflected as light 301c towards the carrier 102.

In some embodiments, portions 301b of the light 301a may also be absorbed by the layer 309b, as illustrated in FIG. 3. This portion 301b may trigger photoablation process 305 in the layer 309b, which may result in de-bonding of the component 108b. Thus, after de-bonding, the bond layers 304 may still be attached to the carrier 102, while the layers 309 (e.g., along with the respective components 108) may be detached from the carrier 102.

In the systems 100, 200, and 300 of FIGS. 1-3, a single light source 110 is illustrated to project light of a side surface of the carrier 102. However, in some embodiments, multiple light sources may be used, as illustrated in FIG. 4A.

Figure 4A:
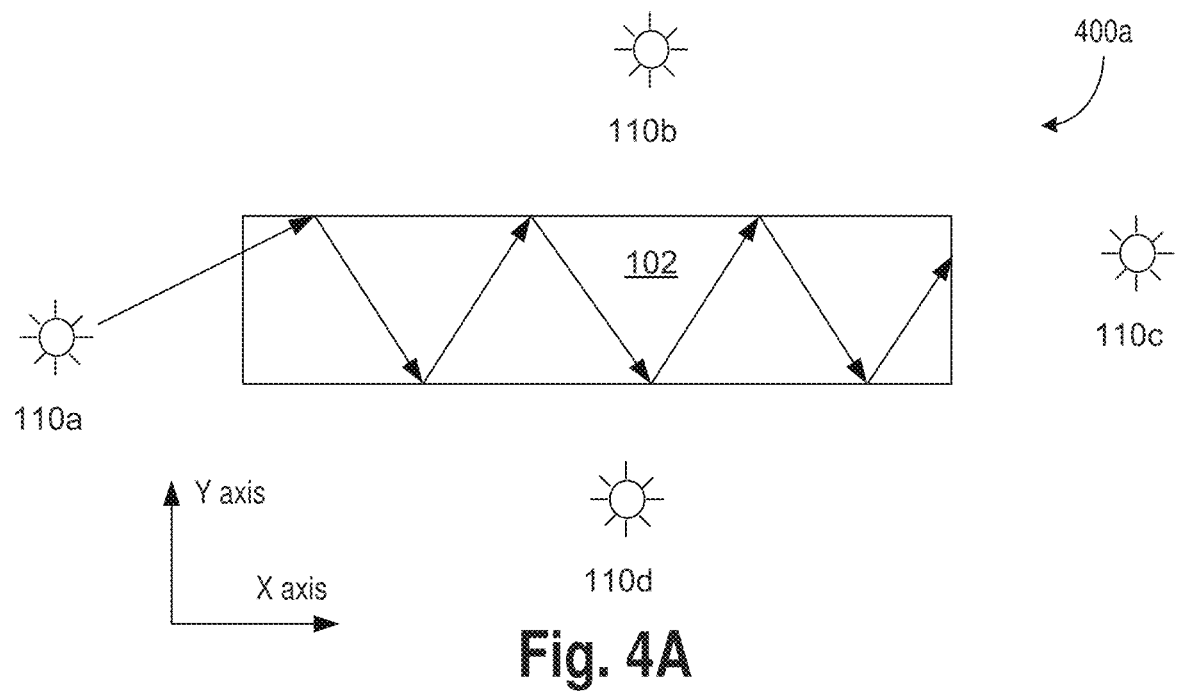
FIG. 4A schematically illustrates a top view of a system including a component carrier, and two or more light sources to project light on the carrier, according to some embodiments.

FIG. 4A schematically illustrates a top view of a system 400a including the component carrier 102 of FIG. 1, 2, or 3 (or any appropriate component carrier discussed herein), and two or more light sources 110a, 110b, 110c, and/or 110d to project light on the carrier 102, according to some embodiments. In the top view of FIG. 4A, for sake of simplicity, merely the carrier 102 is illustrated, without illustrating any other elements (e.g., the component 108a, the bond layers 104, etc.) that may be visible in the top view.

In the example of FIG. 4A, four light sources 110a, 110b, 110c, and 110d are illustrated to be respectively disposed on four sides of the carrier 102. However, in some examples, any other appropriate number of light sources (e.g., two, three, five, or higher) may be used. In some examples, instead of one light source being disposed on each side of the carrier 102, more than one light source may be disposed on one side of the carrier 102. Various possible locations of one or more light sources may be envisioned by those skilled in the art, based on the teachings of this disclosure.

When light from the light source 110a enters the carrier from a first side and initially hits a bond layer, the light has higher energy. However, the energy is partially absorbed by a photosensitive layer adjacent to the carrier 102 (e.g., as discussed with respect to FIGS. 1-3). By the time the light exits the carrier 102 from a second side, the energy of the light may be relatively less. Accordingly, if a single non-movable light source is used, the rate of photoablation process in various sections of the photosensitive layers adjacent to the carrier 102 may be different. In contrast, if light is projected from more than one side of the carrier 102, such difference in the rate of photoablation process may be at least in part reduced. Accordingly, the one or more light sources 110a, 110b, 110c, 110d in the system 400 may result in higher uniformity in the photoablation process of one or more photosensitive layers adjacent to the carrier 102, which may result in an easier de-bonding process.

In some embodiments, one or more of the light sources 110a, 110b, 110c, and 110d may at least in part simultaneously emit light to different sections of the side surface of the carrier 102. In some embodiments, the light sources 110a, 110b, 110c, and 110d may at least in part non-simultaneously emit light to different sections of the side surface of the carrier 102, e.g., one after another light source.

Figure 4B:
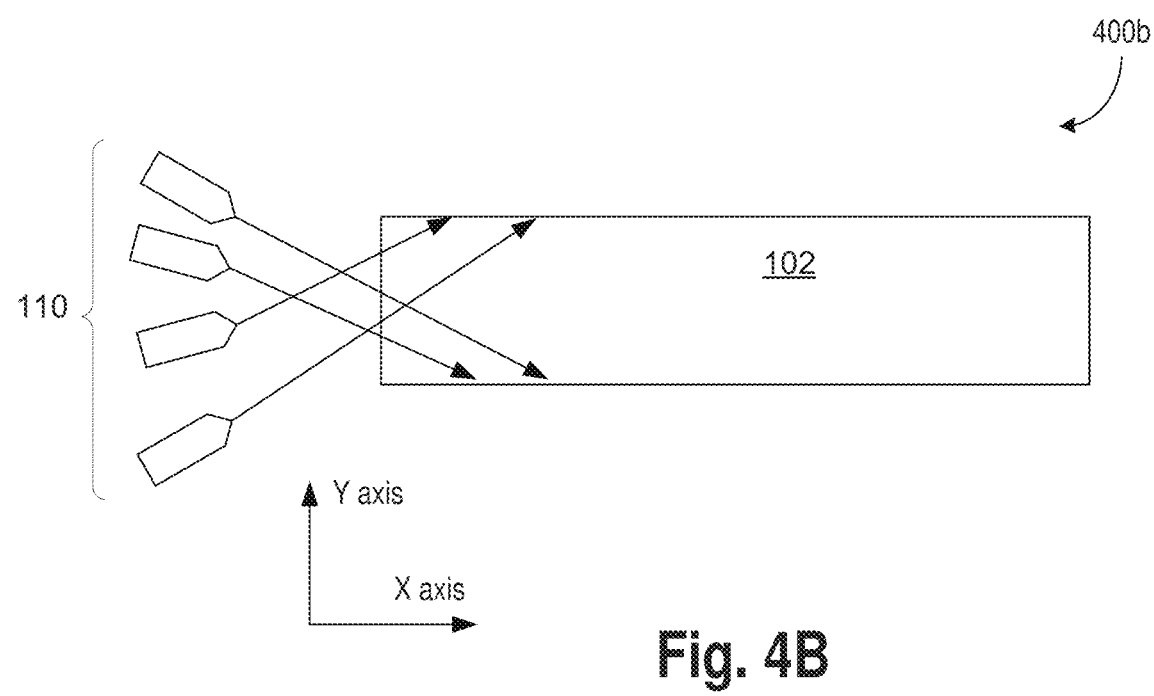
FIG. 4B schematically illustrates a top view of a system including a component carrier, and an array of light sources to project light on the carrier, according to some embodiments.

FIG. 4B schematically illustrates a top view of a system 400b including the component carrier 102 of FIG. 1, 2, or 3 (or any appropriate component carrier discussed herein), and an array of light sources 110 to project light on the carrier 102, according to some embodiments. In the top view of FIG. 4B, for sake of simplicity, merely the carrier 102 is illustrated, without illustrating any other elements (e.g., the component 108a, the bond layers 104, etc.) that may be visible in the top view.

In the example of FIG. 4B, the array of light sources 110 may convey light to the same side of the carrier 102. For example, light from various light sources may be projected with different angles of incidence, which may result in lights from one or more of these light sources undergoing total internal reflection in the carrier 102. In some embodiments, the light sources 110 may at least in part emit light to different sections of the side surface of the carrier 102, thereby ensuring that substantially or almost an entirety of the photosensitive bond layers 104 are exposed to light.

Figure 5:
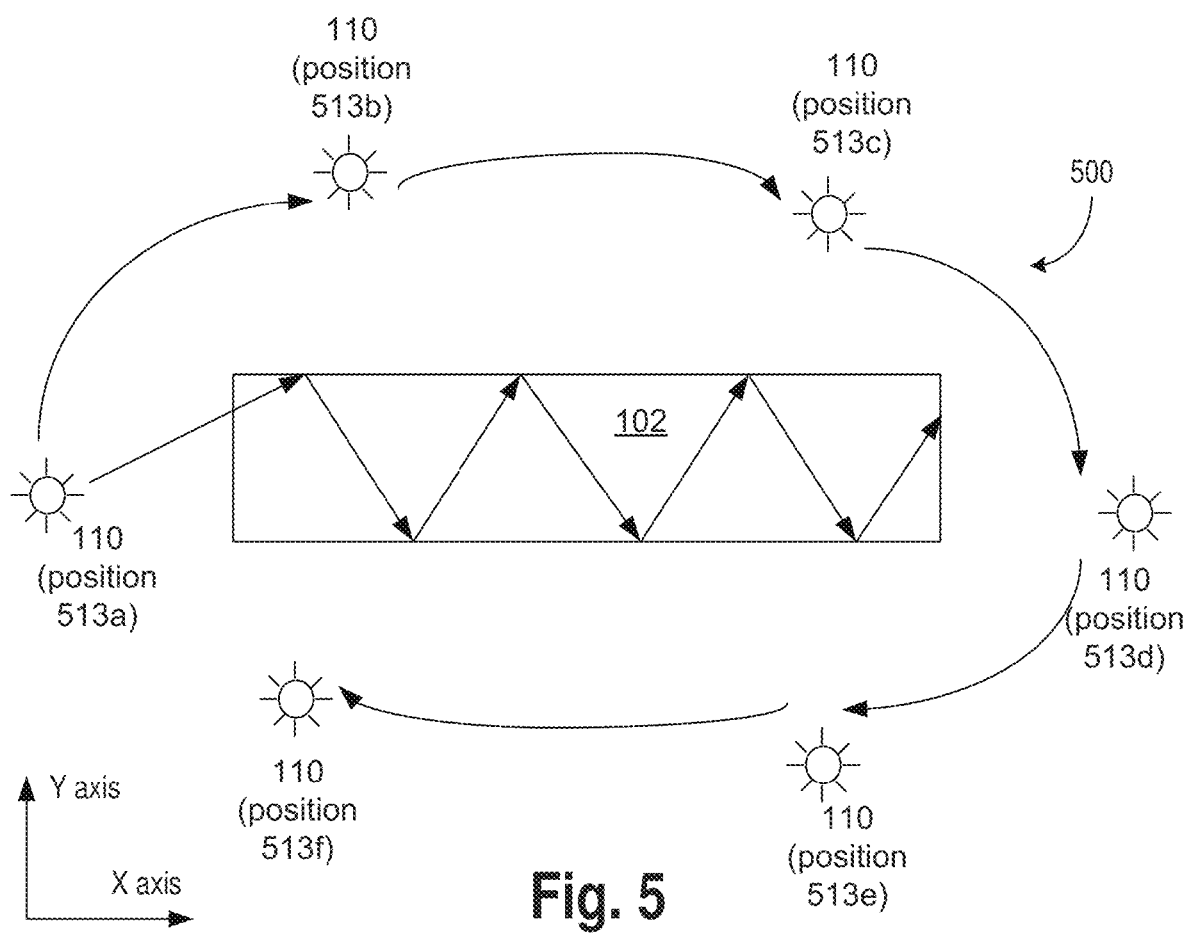
FIG. 5 schematically illustrates a top view of a system including a component carrier, and at least one light source that may be moved relative to the carrier, according to some embodiments.

FIG. 5 schematically illustrates a top view of a system 500 including the component carrier 102 of FIG. 1, 2, or 3 (or any appropriate component carrier discussed herein), and at least one light source 110 that may be moved relative to the carrier 102, according to some embodiments. In the top view of FIG. 5, for sake of simplicity, merely the carrier 102 is illustrated, without illustrating any other elements (e.g., the component 108a, the bond layers, etc.) that may be visible in the top view.

In the example of FIG. 5, the light source 100 may be moved (e.g., rotated) relative to the carrier 102, such that the light source 110 may project light to various sections of a side surface of the carrier 102. Various example positions 513a, . . . , 513f of the light source 110 is illustrated in FIG. 5. As light is now projected from various sides of the surface, a uniformity with which photosensitive layers adjacent to the carrier 102 receives light may increase, e.g., compared to having a single, non-movable light source.

In some embodiments, the system 500 comprises a rotatable stage (not illustrated in FIG. 5), which may move the light source 110, e.g., from the position 513a to the position 513b, from the position 513b to the position 513c, and so on. At each position, the light source 110 may convey a beam of light for at least a threshold period of time. Although a single light source is illustrated to be moving around the carrier 102, in some examples, an array of light sources may be moved around the carrier 102 (e.g., a combination of FIGS. 4B and 5).

Figure 6A:
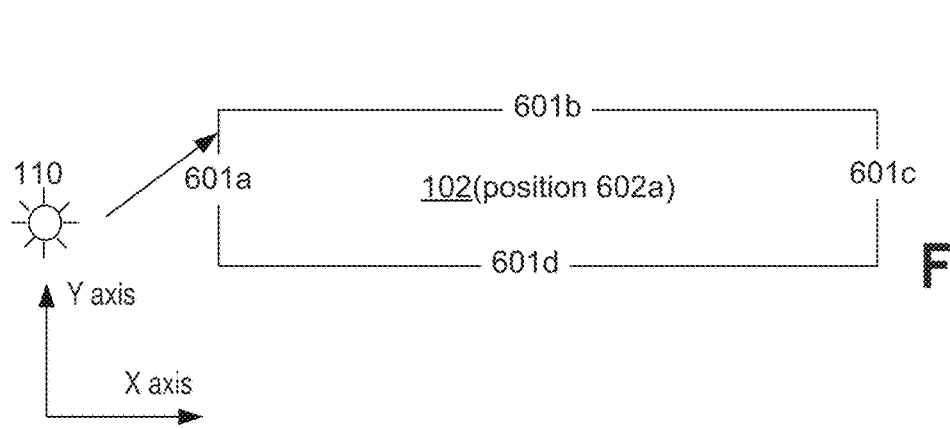
FIGS. 6A-6C schematically illustrate top views of a system including a component carrier, and at least one light source, where the carrier may be moved relative to the light source, according to some embodiments.
Figure 6B:
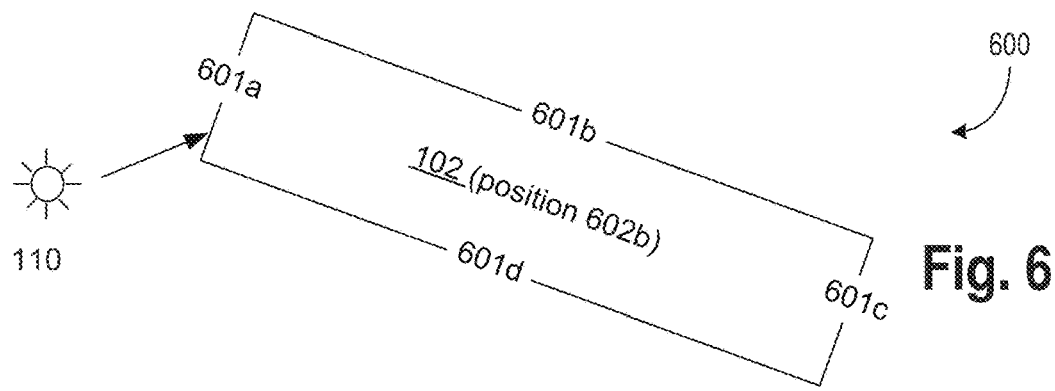
Figure 6C:
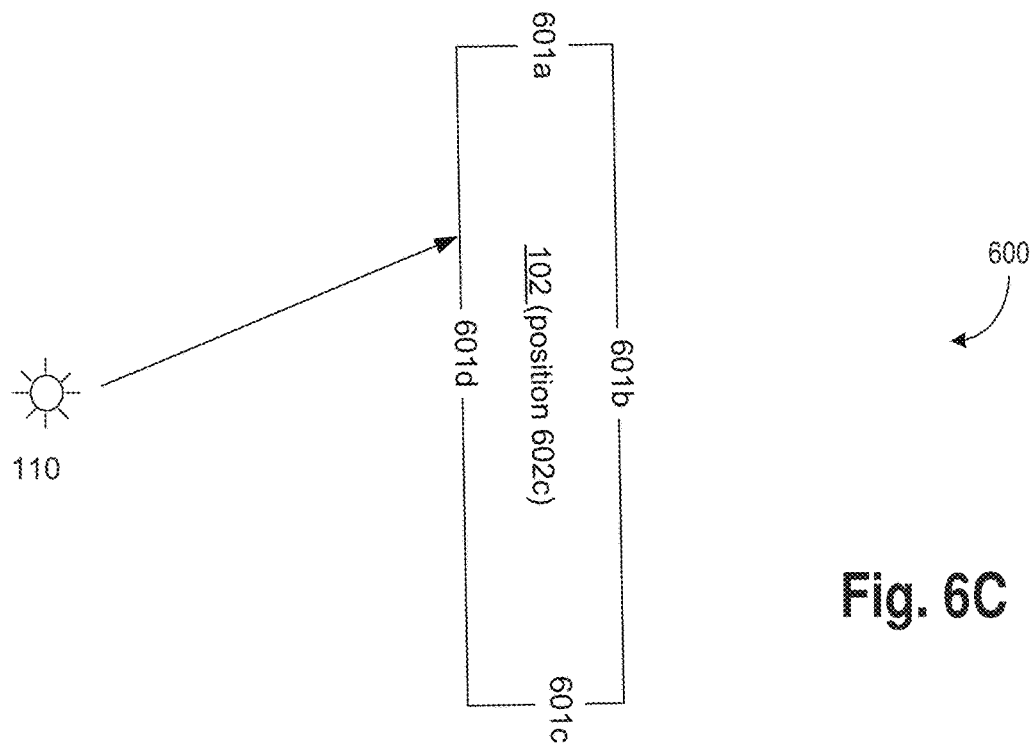

FIGS. 6A-6C schematically illustrate top views of a system 600 including the component carrier 102 of FIG. 1, 2, or 3 (or any appropriate component carrier discussed herein), and at least one light source 110, where the carrier 102 may be moved relative to the light source 110, according to some embodiments. In the top view of FIG. 6, for sake of simplicity, merely the carrier 102 is illustrated, without illustrating any other elements (e.g., the component 108a, the photosensitive layers, etc.) that may be visible in the top view.

In FIGS. 6A-6C, four sides of the carrier 102 are respectively labelled as 601a, 601b, 601c, and 601d. In the example of FIGS. 6A-6C, the carrier 102 may be moved (e.g., rotated) relative to the light source 110, such that the light source 110 may project light to various sections of one or more side surfaces or edges of the carrier 102.

Three example positions 602a, 602b, and 602c of the carrier 102 are respectively illustrated in FIGS. 6A, 6B, and 6C. For example, when the carrier 102 is in position 602a, light from the source 110 is conveyed to a first section of the side surface 601a of the carrier 102, as illustrated in FIG. 6A. When the carrier 102 is in position 602b, light from the source 110 is conveyed to a second section of the side surface 601a of the carrier 102, as illustrated in FIG. 6B. When the carrier 102 is in position 602c, light from the source 110 is conveyed to another side surface 601d of the carrier 102, as illustrated in FIG. 6C.

Although only three example positions of the carrier 102 relative to the light source 110 are displayed in FIGS. 6A-6C, in some examples, the carrier 102 can be further rotated such that all sides of the carrier 102 face the light source 110. Numerous other example positions of the carrier 102 (e.g., other than those illustrated in FIGS. 6A-6C) may also be possible.

As light is now projected from various sides of the side surface of the carrier 102, a uniformity with which photosensitive layers adjacent to the carrier 102 receive light may increase, e.g., compared to having a single, non-movable light source and a non-movable carrier 102.

In some embodiments, the system 600 comprises a rotatable stage (not illustrated in FIGS. 6A-6C), which may move the carrier 102, e.g., from the position 602a to the position 602b, and so on. At each position, the light source 110 may convey a beam of light for at least a threshold period of time.

In some embodiments, any combination of the systems 400a, 400b, 500, and/or 600 of FIGS. 4A, 4B, 5, and/or 6A-6C may be possible. For example, an array of light (e.g., light sources 110a, . . . , 110d of FIG. 4A, or the array of light source 100 of FIG. 4B) may convey light to various sections of the carrier 110, as the carrier 102 is rotated. For example, there may be at least two light sources to irradiate light on two sides of the carrier 102—the carrier 102 may be rotated by 90 degrees once, which may result in each side of the carrier 102 facing a light source at least once. Thus, such examples may be a combination of FIGS. 4A and 6A-6C, or a combination of FIGS. 4B and 6A-6C.

In another example, an array of light sources may be rotated around the carrier 102. For example, the light source 110 of FIG. 5 may represent an array of light sources, where the whole array of light sources may be rotated around the carrier 102. Thus, such examples may be a combination of FIGS. 4A and 5, or a combination of FIGS. 4B and 5. Any other possible combination of any of FIGS. 4A-6C may also be envisioned by those skilled in the art, based on the teachings of this disclosure.

Figure 7:
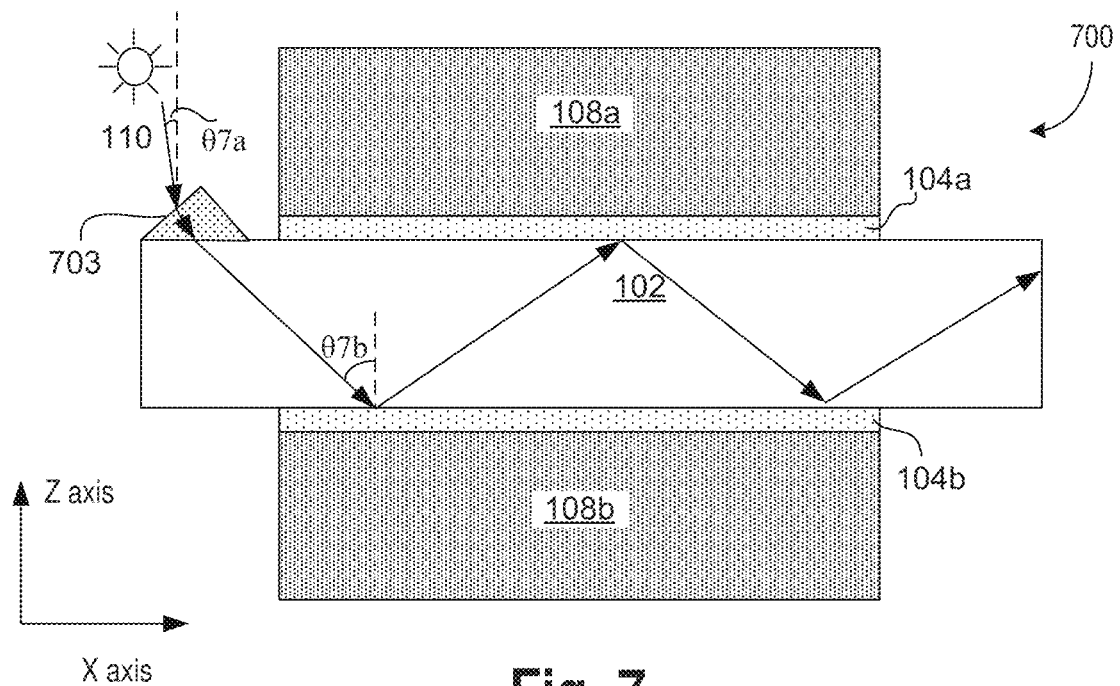
FIG. 7 schematically illustrates cross sectional view of a system including a component carrier having two components attached respectively on two sides of the carrier via respective photosensitive layers, where light is initially projected on a surface of the carrier via a feature on a surface of the carrier, according to some embodiments.

In FIGS. 1-6C, light was projected to the carrier 102 though a side surface or vertical edge of the carrier 102. However, light may also be projected via another appropriate surface of the carrier 102, e.g., a top surface (or a bottom surface) on which a component 108 is attached. FIG. 7 schematically illustrates cross sectional view of a system 700 including a component carrier 102 (e.g., any of the component carrier discussed herein) having two components 108a and 108b attached respectively on two sides of the carrier 102 via respective photosensitive bond layers 104a, 104b, where light is projected via a top surface of the carrier 102 via a feature (e.g., a prism 703) on a surface of the carrier 102, according to some embodiments. The prism 703 (or a feature that may somewhat resemble a prism) is attached to a top surface of the carrier 102, e.g., to a surface on which the component 108a is attached. Light from the light source 110 may pass through the prism 703. Due to refraction of the light passing through the prism (and the refractive index of the prism), an angle of incidence of light $\theta 7b$ at the boundary of the carrier 201 and the bond layer 104 may be greater than the critical angle, which may aid in total internal reflection.

In an example, without the prism 703, the angle of incidence of light at the boundary of the carrier 201 and the bond layer 104 could have been less than the critical angle, and no total internal reflection would have occurred. However, the prism 703 may be used to convey the light at a greater angle of incidence towards the boundary, thereby resulting in the total internal reflection.

For example, the light may reach the prism 703 at a first angle of incidence $\theta 7a$, where the first angle of incidence $\theta 7a$ may not be enough for total internal reflection. The prism 703 may refract the light and propagate the refracted light to boundary of the carrier and the layer 104b at a second angle of incidence $\theta 7b$, where the second angle of incidence $\theta 7b$ may be sufficient to cause the total internal reflection.

Although the prism 703 is illustrated in a top surface of the carrier 102, the location of the prism 703 is merely an example, and the prism 703 may be located in any other appropriate location of the carrier 102. For example, the prism 703 may be located on a side surface or a vertical surface of the carrier 102.

Although a prism 703 is illustrated in FIG. 7, any other appropriate structure or feature may be used. For example, a feature that may tune the angle of incidence of light (e.g., by means of refraction) at the boundary or edge of the carrier 102 may be used. To tune the angle of incidence, the feature may have a refractive index that may be different from the refractive index of the carrier 102. Merely as an example, a transmissive feature filled with fillers (e.g., transmissive fluid) may be used, where the transmissive feature (e.g., including the transmissive filler) may have a refractive index different than the carrier 102 (e.g., to aid in initial refraction of the light). In another example, an appropriate diffraction grating coupler (e.g., possibly with an appropriate index tuning fluid) may be used to introduce the light to the carrier 102 at an angle of incidence that may ensure total internal reflectance within the carrier 102, and may increase the efficiency of light transmission. In yet another example and as discussed herein later with respect to FIGS. 10A-10G, the edges (e.g., the vertical and/or the horizontal edges) of the carrier 102 may also be appropriately profiled, to tune the angle of incidence of light at the boundary and aid in internal reflection.

It may be noted that the prism 703, another appropriate feature, or another appropriate diffraction grating coupler may be used in any of the systems discussed herein, including systems illustrated in FIGS. 1-6C or any subsequent figures, embodiments, or examples discussed herein.

Figure 8:
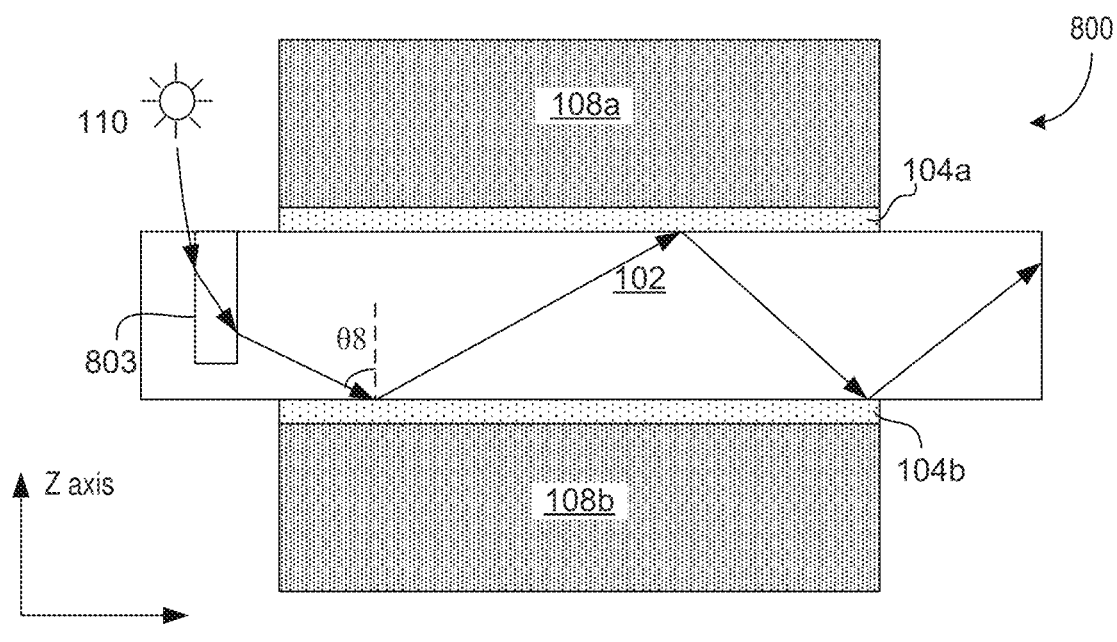
FIG. 8 schematically illustrates cross sectional view of a system including a component carrier having two components attached respectively on two sides of the carrier via respective photosensitive layers, where the carrier has irregularities or material discontinuities in its surface or within the carrier that may aid in tuning an angle of incidence of light and that may aid in internal reflection, according to some embodiments.

FIG. 8 schematically illustrates cross sectional view of a system 800 including the component carrier 102 having two components 108a and 108b attached respectively on two sides of the carrier 102 via respective photosensitive bond layers 104a, 104b, where the carrier 102 has irregularities or material discontinuities in its surface or within the carrier 102 that may aid in tuning an angle of incidence of light and that may aid in total internal reflection, according to some embodiments. The irregularities or material discontinuities illustrated in example FIG. 8 comprises at least one via 803 that may at least partially extend through the carrier 102.

Although the via 803 is illustrated to partially extend through the carrier 102, in some examples, the via 803 may fully extend through the carrier 102 (e.g., a through carrier via). A number and/or a location of the via 803 in FIG. 8 are merely examples. Any different number of vias located at any appropriate section(s) of the carrier 102 may be envisioned by those skilled in the art, based on the teachings of this disclosure.

In some examples, the via 803 may be empty (e.g., filed with air). In some examples, the via 803 may be filled with a transmissive or non-transmissive material, an appropriate refractive index tuning material, an appropriate fluid, reflective material, refractive material (e.g., having a refractive index different from the carrier 102), and/or the like.

In an example, the via 803 may be an initiation point for the light (e.g., the light from the source 110 may hit the via 803, before hitting a boundary between the carrier and a bond layer 104). The refraction of light within the via 803 and/or possible scattering of light by the via 803 may be used to tune and control the incidence angle of the light projected in the boundaries, e.g., to aid in the internal reflection. For example, the via 803 (e.g., the refraction within the via 803) may aid in controlling the dispersion of the light through the carrier 102.

Although the via 803 is illustrated to be an example of an irregularity or material discontinuity in the carrier 102, any other appropriate irregularity or material discontinuities in the carrier 102 may also be formed, such as a trench within the carrier 102, surface roughness in the carrier 102, grooves, channels, recesses and/or cavity in the carrier 102, and/or the like. In an example, roughening at the glass surface may promote scattering at the interface, and/or may help in transmission of at least a part of the light out of the carrier 102. In some examples, a surface of the carrier 102 may be chemically etched (e.g., with controlled depth) to disperse light where desired, and to tune the angle of incidence of light. In some examples, a surface of the carrier 102 may be mechanically, chemically, and/or thermally treated (e.g., polished, cleaned, etc.,) to control the refractive index of light at the surface of the carrier 102, scattering of the light at the boundary of the carrier, etc. In an example, mechanical treatment of the surface of the carrier 102 (e.g., roughening, polishing, etc.) may not change the refractive index of the surface—rather, such treatment may change a geometry of the interface, and may promote scattering of the light (e.g., may help in transmission of at least a part of the light out of the carrier 102). In an example, thermal and/or chemical treatment may alter the refractive index at the surface.

It may be noted that irregularities or material discontinuities on or within the carrier 102 (e.g., the via 803) may be used in any of the systems discussed herein, including systems illustrated in FIGS. 1-7 or any subsequent figures, embodiments, and/or examples discussed herein.

Figure 9A:
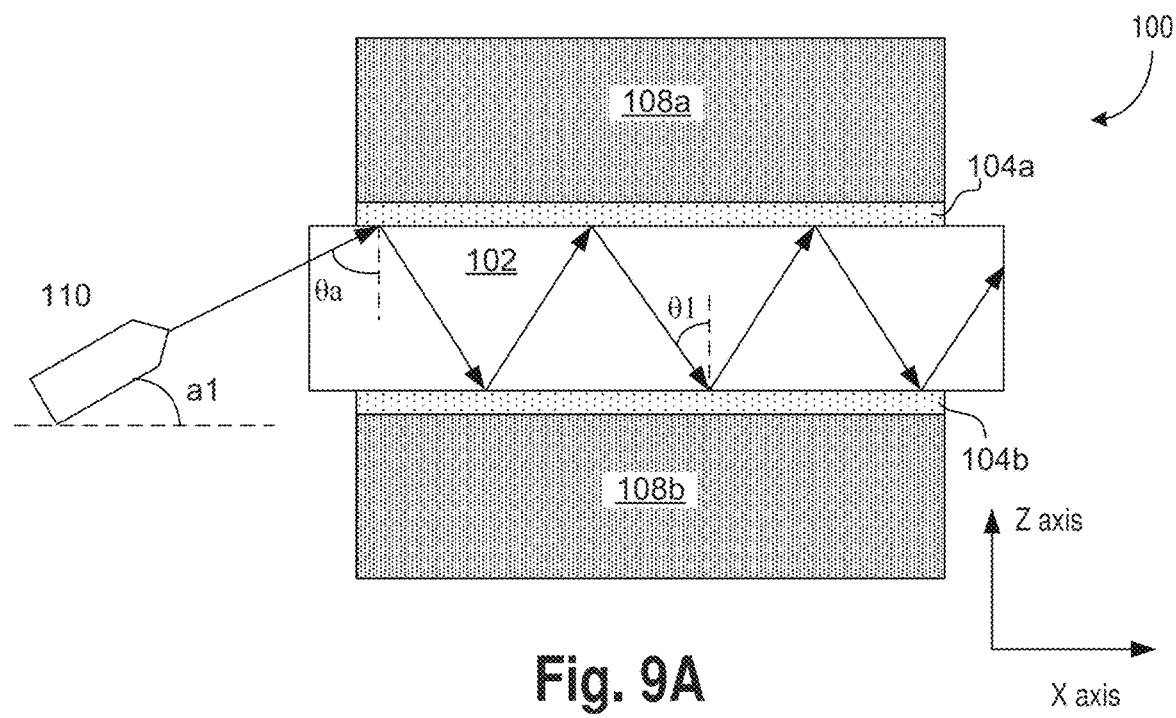
FIGS. 9A-9B schematically illustrates cross sectional view of a system including a component carrier having two components attached respectively on two sides of the carrier via respective photosensitive layers, wherein an incidence angle of the light in the boundary of the carrier and a photosensitive layer may be tuned by adjusting a direction of light from the light source, according to some embodiments.
Figure 9B:
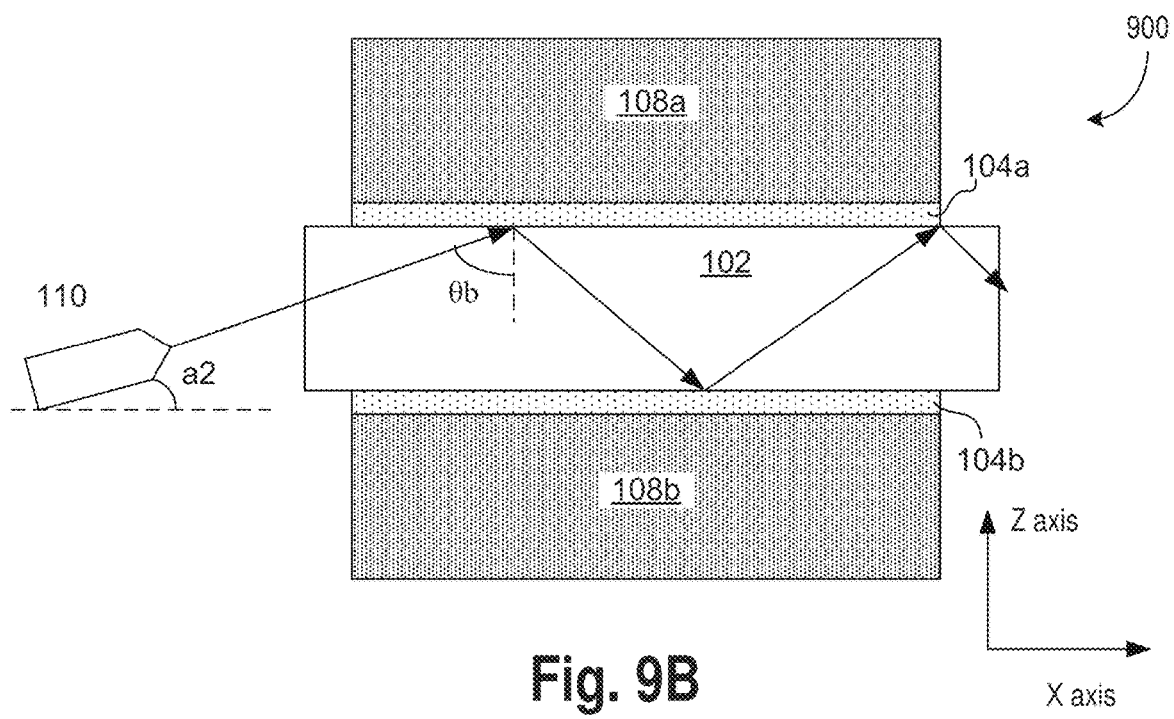

FIGS. 9A-9B schematically illustrates cross sectional view of a system 900 including a component carrier 102 (e.g., any of the component carrier discussed herein) having two components 108a and 108b attached respectively on two sides of the carrier 102 via respective photosensitive layers (e.g., layers 104, 204, 309, etc.), wherein an incidence angle of the light in the boundary of the carrier 102 and a photosensitive layer may be tuned by adjusting a direction of light from the light source 110, according to some embodiments. In FIGS. 9A-9B, two different positions of the light source 110 are illustrated. It is assumed that the light source 110 is directional, e.g., a direction at which light is conveyed by the light source 110 may be controlled by controlling a position of the light source 110. Merely as an example, in FIG. 9A, the light source 110 is assumed to be at an angle a1 with respect to the X axis; and in FIG. 9B, the light source 110 is assumed to be at an angle a2 with respect to the X axis. The change in the position of the light source 110 may change an incidence angle of the light at the boundary of the carrier 102 and the bond layer 104a from angle θa in FIG. 9A to angle θb in FIG. 9B.

Thus, by rotation of the light (e.g., to change an angle or direction of light projected by the light source), an angle of incidence of the light may be controlled, thereby controlling the internal reflection of the light in the carrier 102. In some embodiments, the light source 110 may be placed on a rotating or position adjustable mount (not illustrated in FIGS. 9A-9B), which may adjust the direction of the light projected by the light source 110.

It may be noted that the principles discussed with respect to FIGS. 9A-9B may be used in any of the systems discussed herein, including systems illustrated in FIGS. 1-8 or any subsequent figures, embodiments, and/or examples discussed herein.

FIGS. 10A-10G illustrate various example edge profiles of the carrier 102, according to some embodiments. For example, a carrier 102 used in any of the systems discussed herein (e.g., with respect to FIGS. 1-9B) may have a vertical edge at the side surfaces. In some examples, the side surfaces of the carrier 102 may be modified, e.g., in accordance with any of the example side surfaces illustrated in FIGS. 10A-10G or in accordance with any other appropriate side surface, to tune or control light refraction through the edge, and to eventually tune or control an angle of incidence at a boundary of the carrier 102 and an adjacent photosensitive layer.

For example, during the manufacturing of the carrier 102 (e.g., which may be a glass carrier), it may be possible to create different profiles around the edge of the carrier panel. An edge profile may be selected to improve the toughness and/or mechanical strength of the panel edge. In some examples, the edge profile may also be selected to generate or control an initial refraction of the light (e.g., at least in part similar to the effect that the prism 703 or the via 803 of FIG. 7 or 8 have), e.g., to control or tune the incidence angle of the light. For example, the initial refraction of the light at the edge profile of the carrier 102 may help in the light reaching or exceeding the critical angle for total internal reflection throughout the rest of the carrier 102.

The edge profiles illustrated in FIGS. 10A-10G are merely examples, and any of these edge profiles or another appropriate edge profile may be selected. For example, an edge profile resulting in the incidence angle of light at the boundary being more than the critical angle may be selected.

Figure 10A:
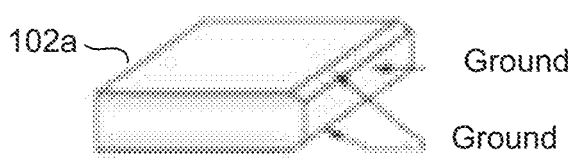
FIGS. 10A-10G illustrate various example edge profile of a carrier, according to some embodiments.
Figure 10B:
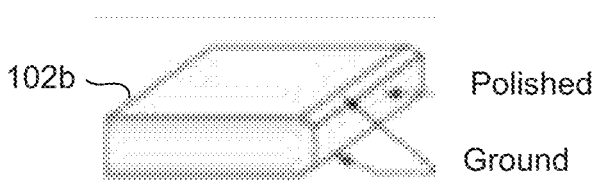
Figure 10C:
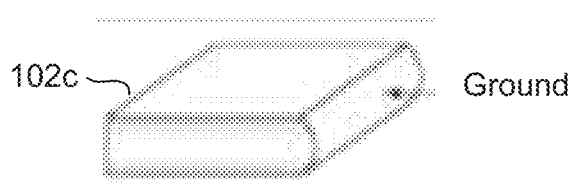
Figure 10D:
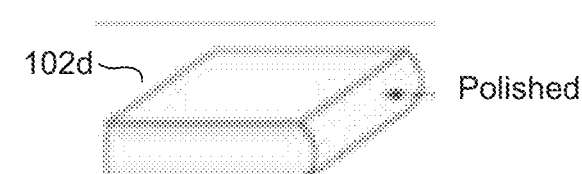
Figure 10E:
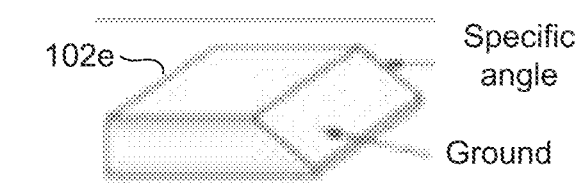
Figure 10F:
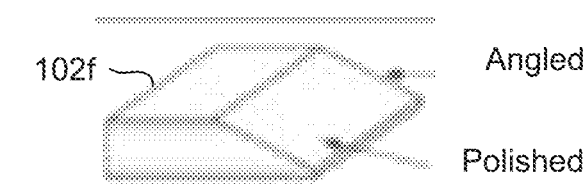
Figure 10G:

Merely as examples, the edge profile illustrated in the example carrier 102a in FIG. 10A includes two ground edges (also referred to as a flat ground edge profile). The edge profile illustrated in the example carrier 102b in FIG. 10B includes a ground edge and a polished edge (also referred to as a flat polish edge profile). The edge profile illustrated in the example carrier 102c in FIG. 10C includes a ground edge (also referred to as a ground pencil edge profile). The edge profile illustrated in the example carrier 102d in FIG. 10D includes a polished edge (also referred to as a polished pencil edge profile). The edge profile illustrated in the example carrier 102e in FIG. 10E includes a ground edge at an angle (e.g., at one of a 22 degree angle, a 45 degree angle, a 67 degree angle, or the like (also referred to as a ground miter edge profile). The edge profile illustrated in the example carrier 102f in FIG. 10F includes a polished edge and an angled edge (e.g., at one of a 5 degree angle, a 22 degree angle, a 45 degree angle, a 67 degree angle, or the like), also referred to as a bevel edge profile. The edge profile illustrated in the example carrier 102g in FIG. 10G includes two seamed edge and a natural cut edge (also referred to as seamed edges profile).

Various embodiments discussed herein (e.g., embodiments discussed with respect to FIGS. 1-10G and other embodiments and examples discussed in this disclosure) proposes various measures for controlling the incidence angle of light in the boundary of the carrier 102 for total internal reflection and/or for increasing the total internal reflection. Such measures may result in the light reaching an increased portion of the boundary of the carrier 102, which may result in photoablation in almost all sections of the attached photosensitive layer. Other measures may also be taken to control or increase total internal reflection.

For example, the bond layers 104, 204, other layers (e.g., layers 309 of FIG. 2), and/or the surface of the carrier 102 may be tuned to control the refractive indices of these elements, and to control the total internal reflection. Merely as an example, the bond layers 104, 204 and/or various other layers (e.g., layers 309 of FIG. 3) may be doped with dopants and/or selectively chosen to tune their refractive index. Similarly, the refractive index of the carrier 102 may also be controlled. For example, the surface of the carrier 102 may be coated with a material to tune or control the refractive index of the surface of the carrier 102. In other examples, the surface of the carrier 102 may be treated thermally, mechanically and/or chemically to control the refractive index of the surface of the carrier 102. Merely as an example, the surface of the carrier 102 may be polished to make smoother, or treated to make rougher, e.g., to control the refractive index of the surface of the carrier 102.

In some embodiments, an amount of time a light source irradiates the carrier 102 at a specific spot may be based on one or more factors, such as a power of the light from the light source, an angle of incidence of the light at the boundary, energy needed for the photoablation process, etc. For example, one or more factors, such as the power of the light source, a time duration for which light is conveyed at a particular spot on the carrier 102, an angel of incidence of the light, energy needed for the photoablation process, etc., may be interrelated—one of these factors may be modulated or controlled to control another one or more of these factors.

Figure 11:
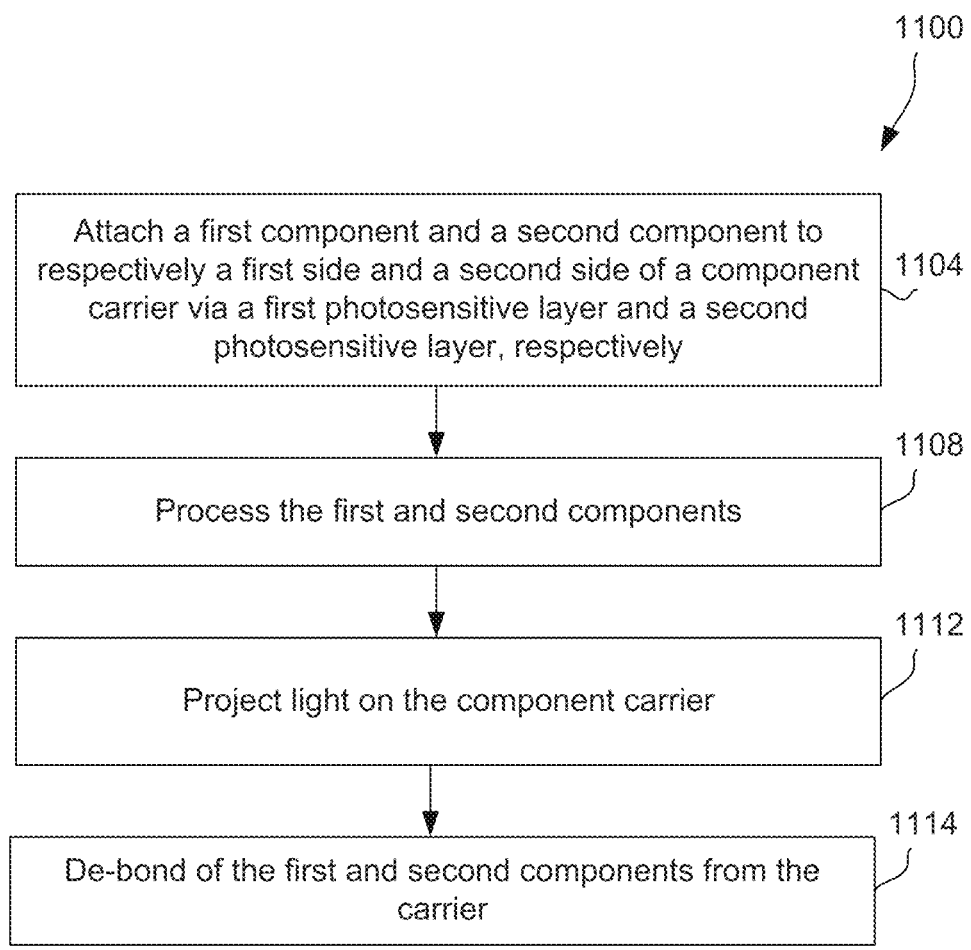
FIG. 11 illustrates a flowchart depicting a method for de-bonding components from a dual-sided carrier using photoablation process, according to some embodiments.

FIG. 11 illustrates a flowchart depicting a method 1100 for de-bonding components from a dual-sided carrier using photoablation process, according to some embodiments. Although the blocks in the flowchart with reference to FIG. 11 are shown in a particular order, the order of the actions can be modified. Thus, the illustrated embodiments can be performed in a different order, and some actions/blocks may be performed in parallel. Some of the blocks and/or operations listed in FIG. 11 may be optional in accordance with certain embodiments. The numbering of the blocks presented is for the sake of clarity and is not intended to prescribe an order of operations in which the various blocks must occur.

At 1104, a first component and a second component (e.g., components 108a, 108b) are respectively attached to a first side and a second side of a component carrier (e.g., carrier 102) via a first photosensitive layer and a second photosensitive layer (e.g., layers 104, 204, 309, etc.), respectively. At 1108, the first and second components may be processed (e.g., to form two respectively semiconductor packages).

At 1112, light may be projected on the component carrier. In an example, the light may be projected, such that the light is propagated, through internal reflection, to both the first and second sides of the component carrier. This may cause photoablation process in the first and second photosensitive layers. At 1114, the first and second components may be de-bonded from the carrier, e.g., as a result of the photoablation process in the first and second photosensitive layers.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A system comprising:
   a component carrier having a first side, and a second side opposite the first side; and
   a light source to couple light into the carrier, wherein the carrier is to propagate, through internal reflection, at least a portion the light to both the first and second sides of the carrier, the portion of light sufficient to release a first component and second component affixed to the first and second sides of the carrier via a first photosensitive layer and second photosensitive layer, respectively.

2. The system of claim 1, wherein the carrier is transmissive of the light and has a refractive index larger than that of the first and second photosensitive layer.

3. The system of claim 1, wherein the first photosensitive layer comprises one of:
 a photosensitive bond layer to attach the first component to the carrier; or
 a layer attached between a transmissive bond layer and the first component, wherein the transmissive bond layer is attached to the carrier.

4. The system of claim 1, wherein the carrier is transmissive of the light, and the internal reflection is sustained by a refractive index contrast between: a surface of the carrier, and the first and second photosensitive layers.

5. The system of claim 1, wherein the carrier comprises a glass transmissive of at least a portion of the light from the light source.

6. The system of claim 1, wherein light source comprises a laser, and is to convey a beam of the light into an edge of the carrier at an angle of incidence sufficient to launch the internal reflection.

7. The system of claim 6, wherein the carrier comprises an edge bevel, which causes an initial refraction of the light, such that the angle of incidence at a boundary between the carrier and a surface of the first photosensitive layer is sufficient to launch the internal reflection.

8. The system of claim 1, wherein the light source comprises a laser, and is to convey a beam of the light at a first angle of incidence into a feature at a perimeter of the carrier, the feature to refract the beam from the first angle of incidence into the carrier at a second angle of incidence that supports the internal reflection.

9. The system of claim 1, wherein the carrier comprises one or more material discontinuities to induce refraction or reflection of the light.

10. The system of claim 9, wherein individual ones of the material discontinuities comprise fillers in a feature having a different refractive index than the carrier.

11. The system of claim 9, wherein individual ones of the material discontinuities comprise one or more vias filled with a reflective or refractive material.

12. The system of claim 1, further comprising at least one:
 a rotatable stage to turn the carrier while the light source irradiates a spot on an edge of the carrier;
 an array of light emitters to scan the spot along a path that follows the edge of the carrier; or
 a plurality of light emitters arrayed to converge upon the edge of the carrier from multiple directions.

13. The system of claim 1, wherein the light source is to modulate an angle of incidence of the light as a function of time to vary one or more characteristics of the internal reflection.

14. An apparatus comprising:
 a carrier having a first side, and a second side opposite the first side;
 a first bond layer between a first component and the first side of the carrier; and
 a second bond layer between a second component and the second side of the carrier, wherein:
  the first and second bond layers comprise a photosensitive material;
  the carrier is to propagate light, through internal reflection to both the first and second sides of the carrier; and
  the first and second bond layers are to release the first and second components from the carrier subsequent to exposure to the light.

15. The apparatus of claim 14, wherein the carrier comprises at least one of:
 one or more material discontinuities to induce refraction or reflection of the light;
 one or more vias filled with a reflective or refractive material; or
 a prism to induce refraction or reflection of the light.

16. An apparatus comprising:
 a carrier comprising transmissive material, the carrier having a first side, and a second side opposite the first side;
 a first photosensitive material on the first side; and
 a second photosensitive material on the second side, and wherein the carrier is to receive light, and propagate, through internal reflection, at least a portion the light to both the first and second sides of the carrier, the portion of light sufficient to release a first component affixed to the carrier by the first photosensitive material and release a second component affixed to the carrier by the second photosensitive material.

17. The apparatus of claim 16, wherein the carrier has a refractive index larger than that of each of the first and second photosensitive layers.

18. A method comprising:
 receiving a first component and a second component attached to respectively a first side and a second side of a component carrier via a first photosensitive layer and a second photosensitive layer, respectively; and
 projecting light on the component carrier such that at least a portion of the light is propagated, through internal reflection, to both the first and second sides of the component carrier, to cause a photoablation process in the first and second photosensitive layers.

19. The method of claim 18, further comprising de-bonding of the first and second components from the carrier.

20. The method of claim 18, further comprising processing the first and second components, wherein processing the first and second components comprises forming a first and second semiconductor packages.

* * * * *